SIGNAL TRANSLATING AND ANGLE DEMODULATING SYSTEMS
Filed Jan. 24, 1968
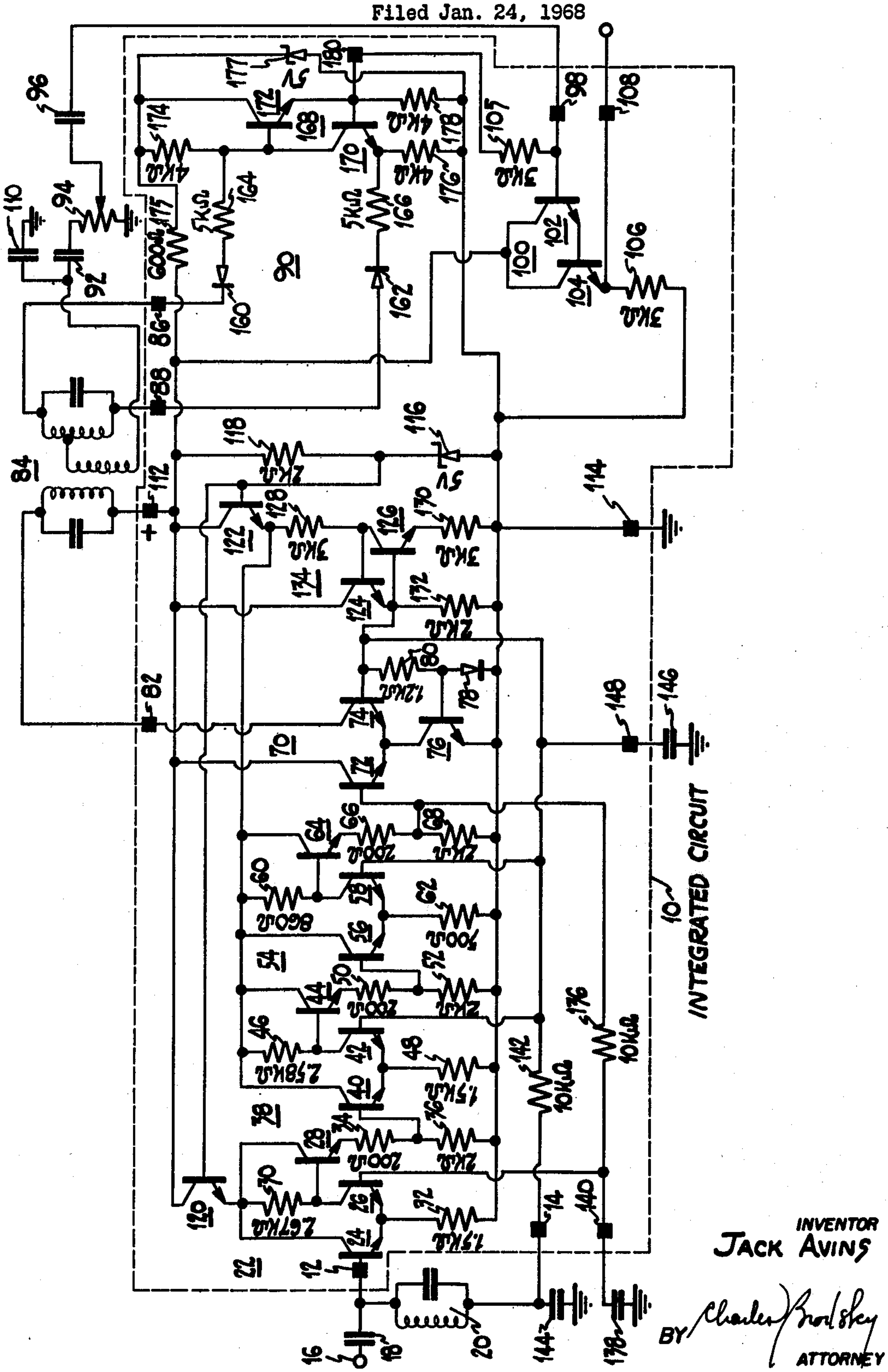
INVENTOR
JACK AVINS
BY Charles Brodsky
ATTORNEY 3,495,178
SIGNAL TRANSLATING AND ANGLE DEMODULATING SYSTEMS Jack Avins, Princeton, N.J., assignor to Radio Corporation of America, a corporation of Delaware Continuation-in-part of application Ser. No. 531,652, Feb. 28, 1966. This application Jan. 24, 1968, Ser. No. 700,131
Int. Cl. H03d 3/22
U.S. Cl. 329—103 10 Claims

ABSTRACT OF THE DISCLOSURE

A high performance frequency modulation detector circuit especially suited for fabrication using integrated circuit techniques employing average detection and a unique biasing scheme to forward bias the rectifiers of the detector so as to maintain balanced, linear operation in the presence of low level signals and increases in environmental temperature.

This invention relates to angle modulated wave demodulating circuits. More particularly, it relates to an improvement of the angle modulated wave detection system described in my continuation-in-part application Ser. No. 531,652, now Patent No. 3,383,607 filed Feb. 28, 1966, entitled "Signal Translating System."

My continuation-in-part application 531,652 describes a frequency modulation (F-M) detector circuit which may be fabricated using integrated circuit techniques. As is described therein, such fabrication is made possible by constructing the circuit as a sampling or average type detector rather than as the more conventional peak type detector. This construction does away with the need for the large capacitors normally used in such prior art detectors and eliminates the known problems large capacitors present to integrated circuit design. At the same time, such construction permits the use of a relatively small amount of capacitance to filter the frequency modulated signal. As is also described in the Ser. No. 531,652 application, that capacitance may be provided by the distributed capacitance of integrated detector load resistors and may further be augmented by the use of the relatively small capacitance of reverse biased rectifier devices.

My continuation-in-part application 531,652 also describes how the average type of F-M detector might be connected to symmetrically drive, and provide the operating bias for, a transistor audio amplifier, also integrated on the same monolithic semiconductor chip.

It is an object of the present invention to provide an integrated angle modulated wave detection system similar to that described above, but with the additional feature that balanced detection is maintained even for low level signal operation, and independent of increases in environmental operating temperatures.

In accordance with an embodiment of the invention, an angle modulated wave detection system includes a frequency discriminator transformer having a primary winding to which angle modulated signals are applied and a secondary winding coupled to the primary winding. It also includes a pair of rectifier devices and a substantially resistive load network. The detection system additionally includes means connecting at least a portion of the secondary winding, the rectifier devices and the resistive load network in series for providing substantially average detection of the angle modulated signals. As will become clear hereinafter, the last mentioned means includes a pair of transistors connected in a feedback configuration and arranged to both forward bias the rectifier devices in the absence of applied signals and to offset any changes in the rectifier characteristics brought about by temperature variations. In this manner, balanced frequency detection will be maintained over a wide range of signal levels, independent of increases in environmental operating temperatures.

One type of feedback arrangement which has been successfully employed in the operation of the present invention and which is described below comprises a form of the fractional bias potential supply disclosed in the pending application Ser. No. 510,307, now Patent No. 3,383,612 filed Nov. 29, 1965 and entitled "Electrical Circuit." An advantage of using such a configuration is that by virtue of its very low impedance, there will generally be little internal attenuation of the signals detected by the system.

The novel features which are considered to be characterstic of this invention are set forth with particularity in the appended claims. The invention itself, however, both as to its organization and method of operation as well as additional objects and advantages thereof, will best be understood from the following description when read in connection with the single figure of the drawing which represents a schematic circuit diagram of an angle modulated wave processing channel for frequency modulated radio receivers which may be incorporated in an integrated circuit device. It is to be understood, however, that the fundamental concepts to be described are more generally applicable. The integrated circuit of the invention, for example, may be used in television or communication receivers.

The schematic circuit diagram of the drawing shows the use of multiple three transistor amplifier stages in the intermediate frequency amplifier of the F-M radio receiver. The dotted box 10 schematically illustrates a monolithic semiconductor circuit chip. The chip has a plurality of contact areas about the periphery thereof, through which connections to the circuit on the chip may be made. For example, the chip 10 has a pair of contact areas 12 and 14 which are coupled to a source of F-M waves. As to physical dimensions, the chip 10 may be of the order of 60 mils x 60 mils, or smaller. The manner of implementing the various transistor, diode and resistor functional portions described below in a monolithic chip is known in the art.

Frequency modulated signals from a suitable source, such as the mixer stage of the F-M radio receiver, are applied between terminal 16 and ground, and are coupled through a capacitor 18 to a resonant circuit 20 which is tuned to the 10.7 ΩHz. intermediate frequency signal. The resonant circuit 20 and the coupling capacitor 18, in the present example, are external to the chip but are coupled thereto through the contact areas 12 and 14.

The contact area 12 is directly coupled to a first amplifier stage 22 including three transistors 24, 26 and 28. The first two transistors 24 and 26 are connected by resistors 30 and 32 to provide an emitter coupled amplifier, and the third transistor 28 is connected by resistors 34 and 36 as an emitter follower. The amplifier stage 22 is shown as being of the type described in the pending application Ser. No. 650,088, filed June 29, 1967, and entitled "Signal Translating System." The output signal developed by the amplifier stage 22 appears at the junction of resistors 34 and 36.

The amplifier stage 22 is directly coupled to a similar amplifier stage 38 which also includes three transistors 40, 42 and 44. The first two transistors 40 and 42 are also connected by a pair of resistors 46 and 48 to form the emitter coupled amplifier construction, while the third transistor 44 is also connected as an emitter follower, by resistors 50 and 52. The output signal from this stage is developed at the junction of resistors 50 and 52.

The amplifier stage 38 is directly coupled to a similar such stage 54. The emitter coupled amplifier of the stage 54 includes the transistors 56 and 58, the load resistor 60 and the common emitter resistor 62. The emitter follower includes the transistor 64 and the serially connected resistors 66 and 68, the junction of which comprises the output point of the amplifier stage 54.

Output signals from the stage 54 are developed across the resistor 68 and applied to a high level limiter stage 70 including transistors 72, 74 and 76, a diode 78 and a resistor 80. The transistor 76 functions as a constant current source for the limiter stage 70, and temperature compensated by the diode 78 in a known manner. The transistor 74 portion of the stage 70 is connected through a contact area 82 to drive the primary winding of a discriminator transformer 84. The secondary winding of the discriminator transformer 84 is connected through a pair of contact areas 86 and 88 to the remainder of the discriminator circuit 90, constructed in accordance with the present invention and to be described hereinafter.

The demodulated signals developed by the discriminator 90 are coupled by means of the tertiary winding of the discriminator transformer 84, a first capacitor 92, a volume control potentiometer 94, a second capacitor 96 and a contact area 98 to the input of an audio frequency amplifier stage 100, including transistor 102 and 104 and resistor 106. Output signals from the stage 100 are developed across resistor 106 and may be taken from the semiconductor chip through a contact area 108. A de-emphasis capacitor 110 is coupled between a point of ground potential and the junction between the tertiary winding and the capacitor 92.

The positive terminal of a D-C supply source for the circuit (which may be subject to some variation) is connected to a contact area 112, while the grounded negative terminal is connected to another contact area 114. The unregulated voltage between the contact areas 112 and 114 is directly applied to the transistor 72 of the high level stage 70 and to the transistors 102 and 104 of the audio frequency amplifier stage 100.

The supply voltage variation is regulated by a Zener diode 116, which is connected between the contact areas 112 and 114 via a resistor 118. Transistors 120 and 122, connected to the contact area 112 and to the Zener diode 116, serve as emitter followers to isolate the regulated voltage fed to the amplifier stage 22 from that fed to the stages 38 and 54.

A pair of transistors 124 and 126 and three resistors 128, 130 and 132 are also included in the circuit of the drawing, and comprise a bias potential supply 134 for the amplifier stages 22, 38 and 54. This supply 134 is of the type disclosed in the pending application Ser. No. 510,307, filed Nov. 29, 1965, and entitled "Electrical Circuit." In a manner analogous to that described therein, the supply 134 develops a voltage across the resistor 132 which is substantially equal to one-half the value of the supply voltage at the end of resistor 128 remote from the collector electrode of transistor 126, and which is independent of temperature and supply voltage variations. Operating point stability of the amplifier stages 22, 38 and 54 is maintained by use of direct current feedback through a resistor 136 around those three stages, with a bypass capacitor 138 connected to the resistor 136 via a contact area 140. The limiter stage 70 is then held automatically at the proper operating point because the feedback around the amplifier stages 22, 38 and 54 holds the voltage at the base electrode of the transistor 72 at one-half the aforementioned supply voltage. The limiter stage 70 is thus balanced without being in the feedback loop. This is desirable because the tendency towards oscillation in the feedback loop is reduced by keeping the number of stages as low as possible. Proper bias voltage for the limiter stage 70 is made essentially independent of transistor current gain through the use of a resistor 142, connected in the base electrode return of transistor 24 and equal in value to the resistor 136 connected in the base electrode return of transistor 26. Bypass capacitors 144 and 146 are connected to the resistor 142 by means of the contact areas 14 and 148, respectively.

Considering, now, the discriminator circuit 90 in more detail, it includes a pair of oppositely poled rectifier devices 160 and 162 and a pair of load resistors 164 and 166. The cathode electrode of the rectifier 160 is shown connected to the contact area 86 while its anode electrode is shown connected to the near end of the resistor 164. Similarly, the anode electrode of the rectifier 162 is indicated as being connected to the contact area 88 while its cathode electrode is connected to the near end of the resistor 166. Also included in the discriminator circuit 90 is a low impedance bias circuit for the rectifiers 160 and 162. Shown by the reference notation "168," this circuit is of the form of operating potential supply disclosed in the Ser. No. 510,307 application.

To be more specific, the bias circuit 168 includes a pair of transistors 170 and 172. One transistor 170 is arranged in a degenerated common emitter type configuration, with its collector electrode connected to the positive potential contact area 112 through first and second resistors 174 and 175 and with its emitter electrode connected to the reference, or ground, potential contact area 114 through a third resistor 176. The other transistor 172 is arranged in a common collector type configuration, with its collector electrode connected to the contact area 112 via the resistor 175 and with its emitter electrode connected to the contact area 114 by means of a fourth resistor 178. The emitter electrode of the transistor 172 is also connected to the base electrode of the transistor 170 and to a contact area 180. The collector electrode of the transistor 170 is likewise connected to the base electrode of the transistor 172 and to the remaining end of the resistor 164, while the emitter electrode of that same transistor 170 is connected to the remaining end of the resistor 166. In the present example, the resistor 174 is selected to be of substantially the same resistance value as the resistor 176. Different valued resistors may be used instead, as described in that Ser. No. 510,307 application, without detracting from the scope of the present invention.

The discriminator circuit 90 is of the general type described in the pending application entitled "Signal Translating System," Ser. No. 531,652, filed Feb. 28, 1966. As is therein described, the circuit 90 employs an average type detection, with the distributed capacitance of the integrated load resistors 164 and 166 providing filtering of the signal frequency and its harmonics. With a Zener diode 177 connected between the collector electrode of transistor 172 and the ground contact area 114, and with the component values shown in the drawing, a quiescent direct potential of approximately +2.5 volts is developed at the contact area 180, and serves as the reference potential for the discriminator 90.

One feature of the discriminator circuit 90 is that balanced detection is maintained for low level signal operation. In one embodiment of the Ser. No. 531,652 discriminator, the load resistors corresponding to the resistors 164 and 166 herein were connected together at their "remaining" ends, and a reference potential of +2 volts was applied to their common junction. The audio frequency output signal was taken from the tertiary of the discriminator transformer and was centered at the +2 volt reference potential. It was found, however, that conduction of the coupling rectifiers (160 and 162 in this case) would not occur until the signals applied to their input electrodes were of a magnitude sufficient to overcome the "contact" potentials of these devices. Since the coupling rectifiers were fabricated in a monolithic silicon structure, where the base-to-emitter $V_{be}$ voltage of a forward biased junction equals approximately 0.7 volt, an input signal swing of at least this 0.7 volt amount was required to forward bias these devices and cause conduction. Where the signal swing satisfied this requirement, balanced detection followed directly. But when the signal swing fell below this value, rectifier conduction ceased, the discriminator load circuit was disconnected from the input signal circuit, and the audio output signal was lost. As a result, the overall detection characteristic provided became non-linear.

With the inclusion of the bias circuit 168 as shown in the drawing of this application, however, conduction of the rectifiers 160 and 162 continues for signal swings well below this 0.7 volt minimum. As with the discriminator circuit of the 531,652 pending application, audio frequency output signals are taken from the transformer tertiary centered at the reference potential, which in this case is +2.5 volts as was previously mentioned. Since the "remaining" end of resistor 164 is at a potential approximately 0.7 volt greater than the +2.5 volt reference potential at the contact area 180, due to the forward drop of the base-emitter junction of transistor 172, it will be apparent that negative going signal swings of even very small amount will be sufficient to forward bias rectifier 160 and cause conduction to occur. Similarly, since the "remaining" end of resistor 166 is at a potential 0.7 volt below the +2.5 volt reference potential, due to the drop of the base-emitter junction of transistor 170, positive going signal swings of very small amount will be sufficent to overcome the "contact" potential of rectifier 162 and bias it into conduction. The balanced detection described in the Ser. No. 531,652 application will thus be maintained even for low level signals since the "contact" potentials will be overcome as soon as input signals are applied.

A second feature of the discriminator circuit 90 is that the bias circuit 168, while enabling the balanced detection to be continuous at low signal level, is also useful for purposes of automatic frequency control (AFC). More particularly, in the AFC control mode an external switch and a large resistor (not shown) can be employed to connect the tertiary output of the discriminator transformer to a variable capacity device in the local oscillator section of the F-M receiver arranged to provide proper tuning with an applied +2.5 volt potential. For applied signal frequencies such that the discriminator "S" characteristic is centered at some potential other than the 2.5 volt reference, the control circuitry within the local oscillator will make the necessary adjustments to provide the correct discriminator centering, as is well known. To defeat the AFC control and manually fine tune the local oscillator, the external switch may be used to connect the 2.5 volt reference potential at the contact area 180 to the variable capacity device. Since, as described in the Ser. No. 510,307 application, the impedance at the contact area 180 is very low (being of the order of 20 ohms), connection of that capacity device and the local oscillator circuitry will have little effect on upsetting the value of the reference potential. It should be noted that the similar impedances present at the collector and emitter electrodes of the transistor 170 being substantially less than the illustrated 5 kilohm value for the load resistors 164 and 166 also prevent signal attenuation within the bias circuit portion of the discriminator 90.

A third feature of the discriminator circuit 90 is that the operations described above will be maintained in the presence of environmental temperature variations, particularly those resulting from heat generation. Thus, as the temperature increases and the base-to-emitter $V_{be}$ voltages of the forward biased junctions decrease, it will be seen that the fall in the collector potential of the transistor 170 due to the decreasing $V_{be}$ voltage of that transistor will be exactly offset by the corresponding $V_{be}$ decrease of transistor 172, the gain for the transistor 170 stage being unity. The +2.5 volt reference potential at the emitter electrode of transistor 172, and at the contact area 180, will therefore be maintained. The coupling rectifiers 160 and 162 will continue to be forward biased by the circuit 168, furthermore, since the decreasing $V_{be}$ drops of the transistors 170 and 172 will be matched by the decreasing "contact" potential of those devices.

As was previously mentioned, changing the ratio of resistors 174 and 176 in the bias circuit 168 will generally have no effect upon the operation of the discriminator 90. A different reference potential and audio frequency output center voltage will result, but the 0.7 volt offset voltage provided by the base-emitter junctions of the transistor 170 and 172 will be maintained to forward bias the rectifiers 160 and 162. Where resistor 174 is twice the value of resistor 176, for example, the reference potential for the discriminator 90 and the centered audio frequency output signal will approximately be at a +1.67 volt level, and temperature tracking will substantially continue as heretofore described.

What is claimed is:

1. An angle modulated wave demodulating system comprising:

a first winding providing a first source of angle modulated waves;

means coupled to said first winding providing a second source of angle modulated waves, which at the center frequency are in phase quadrature with said first provided angle modulated waves, said means having a point at which detected angle modulated waves are developed referenced to a predetermined direct potential;

first and second rectifiers;

first and second resistors;

and means connecting said first winding, said first rectifier, said first resistor, said second resistor and said second rectifier in a circuit loop, with said first and second rectifiers poled in the same direction in the loop;

said last-mentioned means also providing a first potential to the end of said first resistor remote from said first rectifier of a magnitude greater than said direct potential and further providing a second potential to the end of said second resistor remote from said second rectifier of a magnitude less than said direct potential.

2. An angle mdoulated wave demodulating system as defined in claim 1 wherein said first provided potential is of a magnitude greater than said direct potential by an amount substantially equal to the forward voltage drop of said first rectifier.

3. An angle modulated wave demodulating system as defined in claim 1 wherein said second provided potential is of a magnitude less than said direct potential by an amount substantially equal to the forward voltage drop of said second rectifier.

4. An angle modulated wave demodulating system as defined in claim 1 wherein said first provided potential is of a magnitude greater than said direct potential by an amount substantially equal to the forward voltage drop of said first rectifier;

and wherein said second provided potential is of a magnitude less than said direct potential by an amount substantially equal to the forward voltage drop of said second rectifier.

5. An angle modulated wave demodulating system as defined in claim 1 wherein said last mentioned means also provides the direct potential to which the detected angle modulated waves are referenced.

6. An angle modulated wave demodulating system as defined in claim 5 wherein said last mentioned means includes a first transistor having its base, emitter and collector electrodes connected in a degenerated common emitter type configuration and in a degenerative feedback relation with an included second transistor having its base, emitter and collector electrodes connected in a common collector type configuration.

7. An angle modulated wave demodulating system as defined in claim 6 wherein said last mentioned means provides said first, second and direct reference potentials at the collector, emitter and base electrodes of said first transistor, respectively.

8. The combination comprising:
first, second, third and fourth terminals;
first and second resistors;
a first rectifier having an anode electrode connected to one end of said first resistor and a cathode electrode connected to said first terminal;
a second rectifier having an anode electrode connected to said second terminal and a cathode electrode connected to one end of said second resistor;
first and second transistors, each having base, emitter and collector electrodes;
means including a third resistor connecting the collector electrode of said first transistor to said third terminal;
means including a fourth resistor connecting the emitter electrode of said first transistor to said fourth terminal;
a fifth resistor connecting the emitter electrode of said second transistor to said fourth terminal;
a direct current connection from the collector electrode of said first transistor to the other end of said first resistor;
a direct current connection from the emitter electrode of said first transistor to the other end of said second resistor;

a direct current connection from the collector electrode of said second transistor to said third terminal;
a direct current connection from the base electrode of said first transistor to the emitter electrode of said second transistor;
and a direct current connection from the base electrode of said second transistor to the collector electrode of said first transistor.

9. The combination as defined in claim 8 wherein said third and fourth resistors are of substantially the same resistance value.

10. The combination as defined in claim 8 wherein said terminals, said resistors, said rectifiers, said transistors, said means, and said direct current connections are all disposed in a single integrated circuit.

References Cited

UNITED STATES PATENTS

| | | | |
|---|---|---|---|
| 3,103,634 | 9/1963 | Nelson et al. | 329—129 X |
| 3,130,372 | 4/1964 | Zajac | 329—130 |

ALFRED L. BRODY, Primary Examiner

U.S. Cl. X.R.

307—233, 303; 329—129; 330—38